(12) United States Patent
Haspeslagh

(10) Patent No.: US 6,189,767 B1
(45) Date of Patent: Feb. 20, 2001

(54) METHOD OF SECURING AN ELECTRIC CONTACT TO A CERAMIC LAYER AS WELL AS A RESISTANCE ELEMENT THUS MANUFACTURED

(75) Inventor: Harold R. M. Haspeslagh, Kortemark (BE)

(73) Assignee: U.S. Philips Corporation, New York, NY (US)

(*) Notice: Under 35 U.S.C. 154(b), the term of this patent shall be extended for 0 days.

(21) Appl. No.: 08/957,116

(22) Filed: Oct. 24, 1997

(30) Foreign Application Priority Data

Oct. 30, 1996 (EP) .................................................. 96203033

(51) Int. Cl.⁷ ............................ B23K 31/02; H01C 17/06
(52) U.S. Cl. ................................ 228/123.1; 228/180.21; 228/248.1; 29/620
(58) Field of Search ........................... 228/123.1, 179.1, 228/122.1, 248.1, 180.22, 180.21; 29/874, 875, 876, 877, 878, 879, 620

(56) References Cited

U.S. PATENT DOCUMENTS

| | | | |
|---|---|---|---|
| 3,803,711 | * 4/1974 | Dubuc et al. | 29/630 C |
| 3,936,790 | * 2/1976 | Eastwood et al. | 338/25 |
| 4,447,799 | * 5/1984 | Carlson | 338/22 R |
| 4,489,228 | * 12/1984 | Wells et al. | 219/56.22 |
| 4,591,537 | * 5/1986 | Aldinger et al. | 428/698 |
| 5,167,545 | * 12/1992 | O'Brien et al. | 439/874 |
| 5,392,982 | * 2/1995 | Li | 228/124.5 |
| 5,400,953 | * 3/1995 | Maeno | 228/248.1 |
| 5,624,782 | * 4/1997 | Hayakawa et al. | 430/198 |

FOREIGN PATENT DOCUMENTS

| | | | |
|---|---|---|---|
| 295 04 105 U | * 6/1995 | (DE) . | |
| 58158980 | * 9/1983 | (JP) . | |
| 60082824 | * 5/1985 | (JP) . | |

* cited by examiner

*Primary Examiner*—Patrick Ryan
*Assistant Examiner*—Kiley Stoner
(74) *Attorney, Agent, or Firm*—Ernestine C. Bartlett

(57) ABSTRACT

The invention provides a method of securing an electric contact of a metal to a layer of a sintered thick-film paste which is situated on an electrically insulating substrate. In this method, a layer of a non-sintered thick-film paste is provided, in accordance with a desired pattern, on an electrically insulating substrate. Subsequently, the layer is provided with a, preferably block-shaped, body of metal, such as an NiFe-alloy. Next, the layer of the thick-film paste is subjected to a temperature treatment, thereby forming the layer of the sintered thick-film paste. Finally, an electric contact is secured to the body, preferably by welding. The connections made by means of the method in accordance with the invention proved to be very reliable, both electrically and mechanically. The invention can be very advantageously used in the manufacture of passive elements, such as resistors and inductors, as well as in the manufacture of heating elements.

14 Claims, 1 Drawing Sheet

METHOD OF SECURING AN ELECTRIC CONTACT TO A CERAMIC LAYER AS WELL AS A RESISTANCE ELEMENT THUS MANUFACTURED

BACKGROUND OF THE INVENTION

The invention relates to a method of securing an electric contact of a metal to a layer of a sintered thick-film paste, which is situated on an electrically insulating substrate.

The method mentioned above is used, inter alia, to manufacture thick-film resistors and heating elements comprising a resistance layer of a sintered thick-film paste. In the manufacture of such resistance elements, first, a resistance layer in the form of a thick-film paste is provided on an electrically insulating substrate, for example, by means of screen-printing. Subsequently, this layer is sintered at an elevated temperature so as to form a resistance layer of a sintered thick-film paste. After this sintering treatment, electric contacts, for example in the form of lugs or wires of metal, are secured to the sintered layer.

Customarily, such contacts are soldered directly onto the sintered layer, for example by means of a tinman's solder. However, the electrical and mechanical reliability of a metal wire secured in said manner is insufficient. For example, it has been found that the intermetallic bond between the metal contact and the sintered resistance layer is not as good as it should be. It has further been found that soldering the contact directly to the sintered layer may lead to fracture of the ceramic material owing to strong, local heating of the layer.

In accordance with another known method, wires are secured to the ceramic layer via an intermediate layer which is provided by vapor-deposition or sputtering. However, this method is relatively expensive.

SUMMARY OF THE INVENTION

It is an object of the invention to reduce the disadvantages of the above-mentioned methods. The invention more particularly aims at providing a method enabling the contact to be secured to the sintered layer in an inexpensive, electrically and mechanically reliable manner. The invention should also provide a resistance element in which the attachment of the contact to the sintered resistance layer is improved.

These and other objects of the invention are achieved by a method of securing an electrical contact to a layer of a sintered thick-film paste, which is situated on an electrically insulating substrate, which method is further characterized in that a layer of a non-sintered thick-film paste is provided in accordance with a desired pattern on an electrically insulating substrate, whereafter said layer is provided with a body of a metal, after which the layer of the thick-film paste is subjected to a temperature treatment, thereby forming the layer of sintered thick-film paste, and finally the electric contact is secured to the body.

In experiments it has been established that by means of the method in accordance with the invention, contacts can be made to a layer of a sintered thick-film paste which are very reliable from an electrical and mechanical point of view. During sintering of the layer of the thick-film paste, a good electrical and mechanical connection is made between the body and the ceramic layer resulting from the sintering treatment. The metal bodies can be placed on or against the layer of thick-film paste to be sintered. The best adhesion is obtained, however, if the body is partially pressed into the layer of a non-sintered thick-film material.

The principle of the method in accordance with the invention can be applied to all types of thick-film pastes. The pastes may comprise solvents, glass frit, etc., as well as metal particles and sintered or non-sintered oxidic particles. If use is made of pastes comprising sintered oxidic particles, the properties of these particles may influence the electrical properties of the layer of sintered thick-film paste to be formed in such a manner that said layer becomes a semiconductor or a poor conductor.

The electric contact can be secured to the metal body in various ways, for example by means of a soldering treatment. A preferred embodiment of the method in accordance with the invention is, however, characterized in that the electric contact is secured to the body by means of welding. This measure has the advantage that the sintered layer cannot be contaminated by lead compounds or solder fluxes. As, in general, the surfaces to be welded are relatively small, use is preferably made of laser welding.

In principle, the body may consist of a large number of metals or metal alloys. A condition which has to be satisfied is that the metal or metal alloys used does (do) not melt at the temperature used in the sintering process. Good results are achieved by using bodies of metals and/or alloys comprising predominantly Cu, Fe or Ni. It has been found that, in combination with laser welding, bodies of alloys comprising predominantly NiFe yield the best results.

An interesting embodiment of the method in accordance with the invention is characterized in that block-shaped bodies are used which are provided by means of SMD-technology. It has been found that the method in accordance with the invention can be readily combined with techniques in which SMD-components (Surface Mounted Device) are provided on a substrate by means of SMD-mounting machines. By virtue thereof, the method in accordance with the invention is suitable to be used in mass-production processes.

A further preferred embodiment of the method in accordance with the invention is characterized in that at least a part of the applied layer comprises a semi-conducting material with a thermistor characteristic. This embodiment can be very advantageously used to manufacture self-regulating heating elements or heating elements with a sensor function.

The invention also relates to a resistance element which comprises an electrically insulating substrate carrying a resistance layer of a sintered thick-film paste as well as two electric contacts of a metal. In accordance with the invention, this resistance element is characterized in that the electric contacts are secured to the resistance layer via a metal body. Preferably, the metal body is essentially composed of an alloy of Ni and Fe and is block-shaped. Such a resistance element can be very advantageously used as a heating element, for example in irons, coffee makers and water boilers. In this case, use is preferably made of an enamel substrate.

Another interesting resistance element is characterized in accordance with the invention in that at least a part of the resistance layer comprises a semiconducting material having a thermistor characteristic. Such a type of material exhibits a temperature-dependent resistance value. Above the so-called "transition temperature" of this material, this value exhibits a substantial increase. The use of this material enables self-regulating heating elements to be manufactured. In addition, this type of resistance elements can also be used as a sensor.

These and other aspects of the invention will be apparent from and elucidated with reference to the embodiments described hereinafter.

It is noted that, for clarity, the Figure is not drawn to scale.

DESCRIPTION OF THE PREFERRED EMBODIMENTS

Figure 1A:
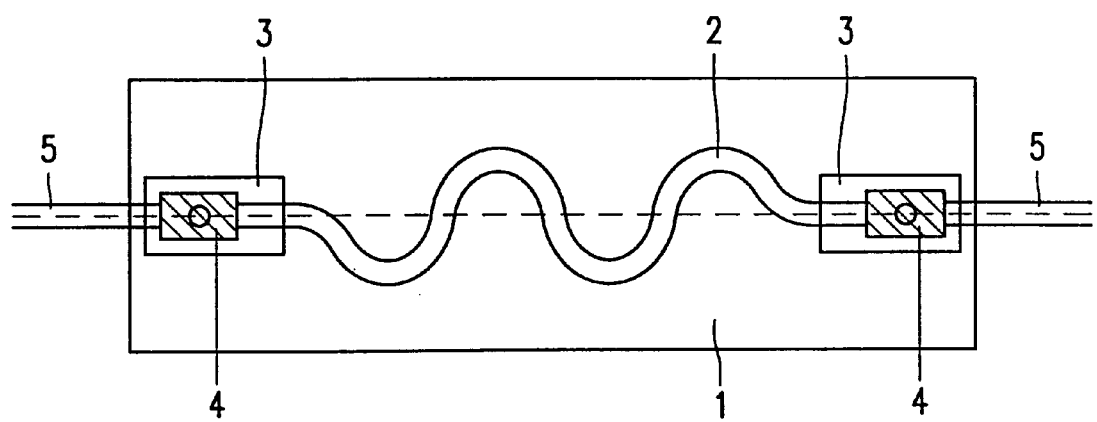
FIG. 1 shows a high-voltage resistor which is manufactured by means of the method in accordance with the invention.
Figure 1B:
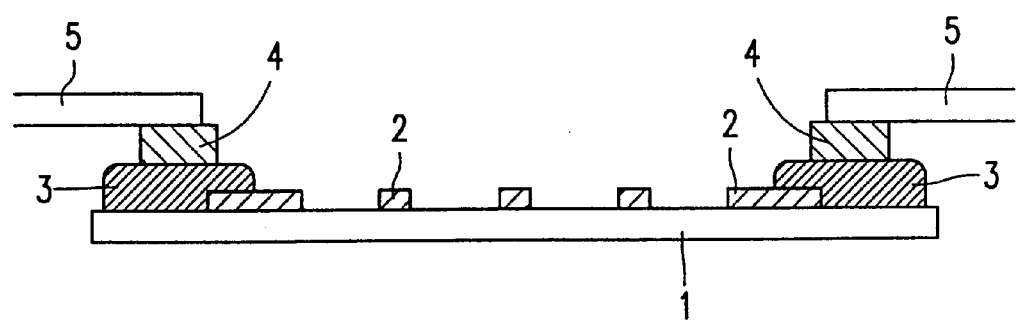

FIG. 1 shows a resistance element in the form of a high-voltage resistor.

FIG. 1-A is a plan view of said resistor. FIG. 1-B is a longitudinal sectional view of said resistor taken on the dotted line shown in FIG. 1-A. The resistor comprises an electrically insulating substrate (1) of aluminium oxide ($Al_2O_3$; 96%) having dimensions of 25 mm by 6 mm by 0.8 mm.

Substrate (1) is provided with a resistance layer (2) of a sintered thick-film paste of a resistance material on the basis of a mixture comprising predominantly $RuO_2$ and glass frit. The end portions of the meander-shaped resistance layer (2) electrically contact two small contact layers (3) of a sintered AgPd paste. A block-shaped body (4) of an alloy comprising predominantly NiFe is secured to the sintered material of each contact layer. Said block-shaped body has the following dimensions: 3.2 mm by 1.6 mm by 0.4 mm. An electric contact (5) in the form of a wire of Cu is secured to each of the block-shaped bodies (4).

The resistance element shown in FIG. 1 is manufactured as follows. A meander-shaped resistance layer (2) and contact layers (3) are successively provided on the electrically insulating substrate (1) by means of screen-printing in accordance with a pattern. Subsequently, block-shaped bodies (4), which are made of a predominantly NiFe-containing alloy, are provided on and partially pressed into the contact layers (3) by means of an SMD-mounting machine. The resultant semi-finished product is introduced into a furnace and subjected to a temperature treatment at maximally approximately 850° C. for 0.5 hours. This temperature treatment causes the screen-printed pastes of the resistance layer and the contact layers to be sintered. Simultaneously, a mechanically and electrically reliable connection is formed between the sintered contact layers and the bodies. The thickness of the sintered layers thus formed is approximately 20 micrometers.

After the temperature treatment, each of the bodies (4) is provided with an electric contact in the form of a wire of Cu whose end to be secured is flattened. These wires are secured to the bodies by means of laser welding. In this manner, an accurate and reliable welded joint is formed between the Cu wire and the block-shaped body. By virtue of the high positional accuracy and the smallness of the necessary dimensions of the welding surface during laser welding, heating of the sintered layer via the bodies is limited.

It is noted that the presence of the contact layers of conductive AgPd in combination with the resistance layer, does not form an essential aspect of the present invention. It is alternatively possible to use only one type of paste, so that the bodies are secured, for example, in the resistive paste. On the other hand, the invention may also be used to manufacture thick-film induction elements, in which case, for example, screen-printed coils of an AgPd paste are provided on an insulating substrate.

The invention provides a method of securing an electric contact of metal to a layer of a sintered thick-film paste which is situated on an electrically insulating substrate. In this method, a layer of a non-sintered thick-film paste is provided, in accordance with a desired pattern, on an electrically insulating substrate. Subsequently, the layer is provided with a, preferably block-shaped, body of metal, such as an NiFe-alloy. Next, the layer of the thick-film paste is subjected to a temperature treatment, thereby forming the layer of the sintered thick-film paste. Finally, an electric contact is secured to the body, preferably by welding. The connections made by means of the method in accordance with the invention proved to be very reliable, both electrically and mechanically. The invention can be very advantageously used in the manufacture of passive elements, such as resistors and inductors, as well as in the manufacture of heating elements.

What is claimed is:

1. A method of securing an electrical contact to a layer of a sintered thick-film paste, which is situated on an electrically insulating substrate, which comprises the steps of providing a layer of a non-sintered thick-film paste in accordance with a desired pattern on an electrically insulating substrate, contacting a surface of said layer with a surface of a metallic body, subjecting the layer of the thick-film paste provided with the metallic body to a temperature treatment, thereby forming a layer of sintered thick-film paste provided with a metallic body, and securing an electrical contact to the said metallic body.

2. A method as claimed in claim 1, wherein the metallic body is partially pressed into the layer of the non-sintered thick-film paste.

3. A method as claimed in claim 1, wherein the electrical contact is secured to the metallic body by means of welding.

4. A method as claimed in claim 1, wherein the metallic body is predominantly composed of an alloy of Fe and Ni.

5. A method as claimed in claim 1, wherein at least one block-shaped metallic body is used which is provided by means of SMD-technology.

6. A method as claimed in claim 1, wherein at least a part of the applied layer of a non-sintered thick-film paste comprises a semiconductor material having a thermistor characteristic.

7. A method of securing an electrical metal contact to a layer of a sintered thick-film paste, which is situated on an electrically insulating substrate, which comprises the steps of providing a layer of a non-sintered thick-film paste in accordance with a desired pattern on an electrically insulating substrate, contacting a surface of said layer with a surface of a metallic body, subjecting the layer of the thick-film paste provided with the metallic body to a temperature treatment, thereby forming a layer of sintered thick-film paste provided with a metallic body, and securing an electrical metal contact to the said metallic body.

8. A method as claimed in claim 7, wherein the electrical metal contact is secured to the metallic body by means of welding.

9. A method of securing a metal contact comprising a metal wire to a layer of a sintered thick-film paste comprising AgPd, which is situated on an electrically insulating substrate comprising alumina, which comprises the steps of providing a layer of a non-sintered thick-film paste comprising AgPd in accordance with a desired pattern on an electrically insulating substrate comprising alumina, contacting a surface of said AgPd with a surface of a metallic body comprising bodies of metals and/or alloys comprising predominantly Cu, Fe or Ni, subjecting the layer of the AgPd thick-film paste provided with the metallic body to a temperature treatment, thereby forming a layer of sintered thick-film paste provided with a metallic body, and securing a metal wire to the said metallic body.

10. A method of securing a metal contact comprising a metal wire to a layer of a sintered thick-film paste of a resistance material comprising predominantly $RuO_2$ and glass frit, which is situated on an electrically insulating substrate comprising alumina, which comprises the steps of providing a layer of a non-sintered thick-film paste comprising predominantly $RuO_2$ and glass frit in accordance with a desired pattern on an electrically insulating substrate comprising alumina, contacting a surface of said non-sintered thick-film paste with a surface of a paste comprising AgPd, contacting said paste of AgPd with a surface of a metallic body comprising bodies of metals and/or alloys comprising predominantly Cu, Fe or Ni, subjecting the layers of the resistance material comprising predominantly $RuO_2$ and glass frit, and paste comprising AgPd provided with the metallic body to a temperature treatment, thereby forming a layer of sintered thick-film paste provided with a metallic body, and securing a metal wire to the said metallic body.

11. A method as claimed in claim 9, wherein the metallic body is predominantly composed of an alloy of Fe and Ni.

12. A method as claimed in claim 9, wherein at least one block-shaped metallic body is used which is provided by means of SMD-technology.

13. A method as claimed in claim 9, wherein at least a part of the applied layer of a non-sintered thick-film paste comprises a semiconductor material having a thermistor characteristic.

14. A method as claimed in claim 10, wherein the metallic body is predominantly composed of an alloy of Fe and Ni.

* * * * *